United States Patent
Zhou et al.

(10) Patent No.: US 8,486,283 B2
(45) Date of Patent: Jul. 16, 2013

(54) METHOD OF MAKING FUSIBLE LINKS

(75) Inventors: Peng Zhou, El Cerrito, CA (US); Paul Tsao, Los Altos, CA (US)

(73) Assignee: Sinoelectric Powertrain Corporation, Sunnyvale, CA (US)

( * ) Notice: Subject to any disclaimer, the term of this patent is extended or adjusted under 35 U.S.C. 154(b) by 442 days.

(21) Appl. No.: 12/938,298

(22) Filed: Nov. 2, 2010

(65) Prior Publication Data

US 2012/0103930 A1     May 3, 2012

(51) Int. Cl.
*H01B 13/00*     (2006.01)
*C23F 1/04*     (2006.01)

(52) U.S. Cl.
USPC .................. 216/13; 216/41; 216/58; 216/83; 29/623; 29/623.1

(58) Field of Classification Search
USPC .................. 216/13, 41, 58, 83; 29/623, 623.1
See application file for complete search history.

(56) References Cited

U.S. PATENT DOCUMENTS

| | | | |
|---|---|---|---|
| 2,258,221 A | 10/1941 | Rochow | |
| 3,913,219 A * | 10/1975 | Lichtblau | 29/592.1 |
| 4,135,593 A | 1/1979 | Fowkes | |
| 4,652,964 A | 3/1987 | Zigenbein | |
| 4,862,243 A | 8/1989 | Welch et al. | |
| 5,059,895 A | 10/1991 | Cataldi et al. | |
| 5,158,841 A | 10/1992 | Mennicke et al. | |
| 5,207,276 A | 5/1993 | Scofield | |
| 5,227,259 A | 7/1993 | Weaver et al. | |
| 5,534,759 A | 7/1996 | Evans et al. | |
| 5,542,488 A | 8/1996 | Nixon | |
| 5,608,304 A | 3/1997 | Okumura | |
| 5,624,003 A | 4/1997 | Matsuki et al. | |
| 5,670,861 A | 9/1997 | Nor | |
| 5,767,659 A | 6/1998 | Farley | |
| 5,806,618 A | 9/1998 | Luode | |
| 5,815,824 A | 9/1998 | Saga et al. | |

(Continued)

FOREIGN PATENT DOCUMENTS

| | | |
|---|---|---|
| JP | 2008288046 A | 11/2008 |
| JP | 2011171255 A | 1/2011 |
| WO | 2005086196 A1 | 9/2005 |

OTHER PUBLICATIONS

Article from Tyco Electronics that was published Apr. 14, 2008, entitled "Polymeric Positive Temperature Coefficient". Retrieved form the Internet<http://tycoelectronics.custhelp.com/. 1 page.

(Continued)

*Primary Examiner* — Shamim Ahmed
(74) *Attorney, Agent, or Firm* — May Mowzoon; Jubin Dana

(57) ABSTRACT

Methods of fabricating the fusible link are directed to processing a multi-layer clad foil having a first layer suitable for forming a fusible link and a second layer suitable for forming one or more welding pads. In some embodiments, the first layer is an aluminum layer and the second layer is a nickel layer. A two-step etching process or a single step etching process is performed on the clad foil to form an etched clad foil having multiple tabs made of the second layer used as current collector conductor pads and battery cell conductor pads, and one or more tabs made of the first layer that form aluminum conductors. The aluminum conductors are shaped and sized to form aluminum fusible conductors during either the etching process or a subsequent stamping process. A single fusible link or an array of fusible links can be formed.

35 Claims, 10 Drawing Sheets

U.S. PATENT DOCUMENTS

| | | | |
|---|---|---|---|
| 5,834,132 A | 11/1998 | Hasegawa et al. | |
| 5,861,610 A | 1/1999 | Weiss | |
| 5,903,154 A | 5/1999 | Zhang et al. | |
| 5,929,741 A | 7/1999 | Nishimura et al. | |
| 5,948,298 A | 9/1999 | Ijaz | |
| 6,132,896 A | 10/2000 | Sunderland et al. | |
| 6,337,559 B1 | 1/2002 | Sato | |
| 6,444,350 B1 | 9/2002 | Toya et al. | |
| 6,531,846 B1 | 3/2003 | Smith | |
| 6,631,775 B1 | 10/2003 | Chaney | |
| 6,747,437 B2 | 6/2004 | Chiu | |
| 7,262,605 B2 | 8/2007 | Seo et al. | |
| 7,270,910 B2 | 9/2007 | Yahnker et al. | |
| 7,507,500 B2 | 3/2009 | Donnelly et al. | |
| 7,508,171 B2 | 3/2009 | Carrier et al. | |
| 7,520,355 B2 | 4/2009 | Chaney | |
| 7,667,432 B2 | 2/2010 | West et al. | |
| 7,675,263 B2 | 3/2010 | Kawasumi et al. | |
| 7,923,967 B2 | 4/2011 | Hamaguchi et al. | |
| 7,952,330 B2 | 5/2011 | Mori | |
| 8,004,244 B2 | 8/2011 | Cromer et al. | |
| 8,058,846 B2 | 11/2011 | Kim | |
| 8,198,975 B2 | 6/2012 | Sha et al. | |
| 8,203,312 B2 | 6/2012 | Yoshikawa | |
| 8,289,123 B2 * | 10/2012 | Whitney et al. | 337/295 |
| 2002/0188387 A1 | 12/2002 | Woestman et al. | |
| 2003/0090855 A1 | 5/2003 | Chu et al. | |
| 2003/0205421 A1 | 11/2003 | Allen et al. | |
| 2004/0018417 A1 | 1/2004 | Stack | |
| 2005/0069773 A1 | 3/2005 | Nakai | |
| 2005/0089750 A1 | 4/2005 | Ng et al. | |
| 2007/0018774 A1 * | 1/2007 | Dietsch et al. | 337/159 |
| 2007/0054178 A1 | 3/2007 | Moon et al. | |
| 2007/0089442 A1 | 4/2007 | Tsuchiya | |
| 2007/0188147 A1 | 8/2007 | Straubel et al. | |
| 2008/0053716 A1 | 3/2008 | Scheucher | |
| 2008/0096072 A1 | 4/2008 | Fukusako et al. | |
| 2008/0230288 A1 | 9/2008 | Shiomi et al. | |
| 2008/0275600 A1 | 11/2008 | Rask et al. | |
| 2008/0290080 A1 | 11/2008 | Weiss | |
| 2009/0041992 A1 | 2/2009 | Umeda et al. | |
| 2009/0123814 A1 | 5/2009 | Cabot et al. | |
| 2010/0021802 A1 | 1/2010 | Yang et al. | |
| 2010/0136392 A1 | 6/2010 | Pulliam et al. | |
| 2010/0291418 A1 | 11/2010 | Zhou et al. | |
| 2010/0291419 A1 | 11/2010 | Zhou | |
| 2010/0291426 A1 | 11/2010 | Zhou | |
| 2010/0291427 A1 | 11/2010 | Zhou | |
| 2011/0050175 A1 | 3/2011 | Odaohhara et al. | |
| 2011/0171505 A1 * | 7/2011 | Kishll et al. | 429/82 |
| 2011/0248684 A1 | 10/2011 | Zhou | |
| 2012/0181988 A1 | 7/2012 | Uchibori | |

OTHER PUBLICATIONS

International Search Report, mail date Jun. 30, 2011, International Application No. PCT/US2011/031634, 6 pages.

* cited by examiner

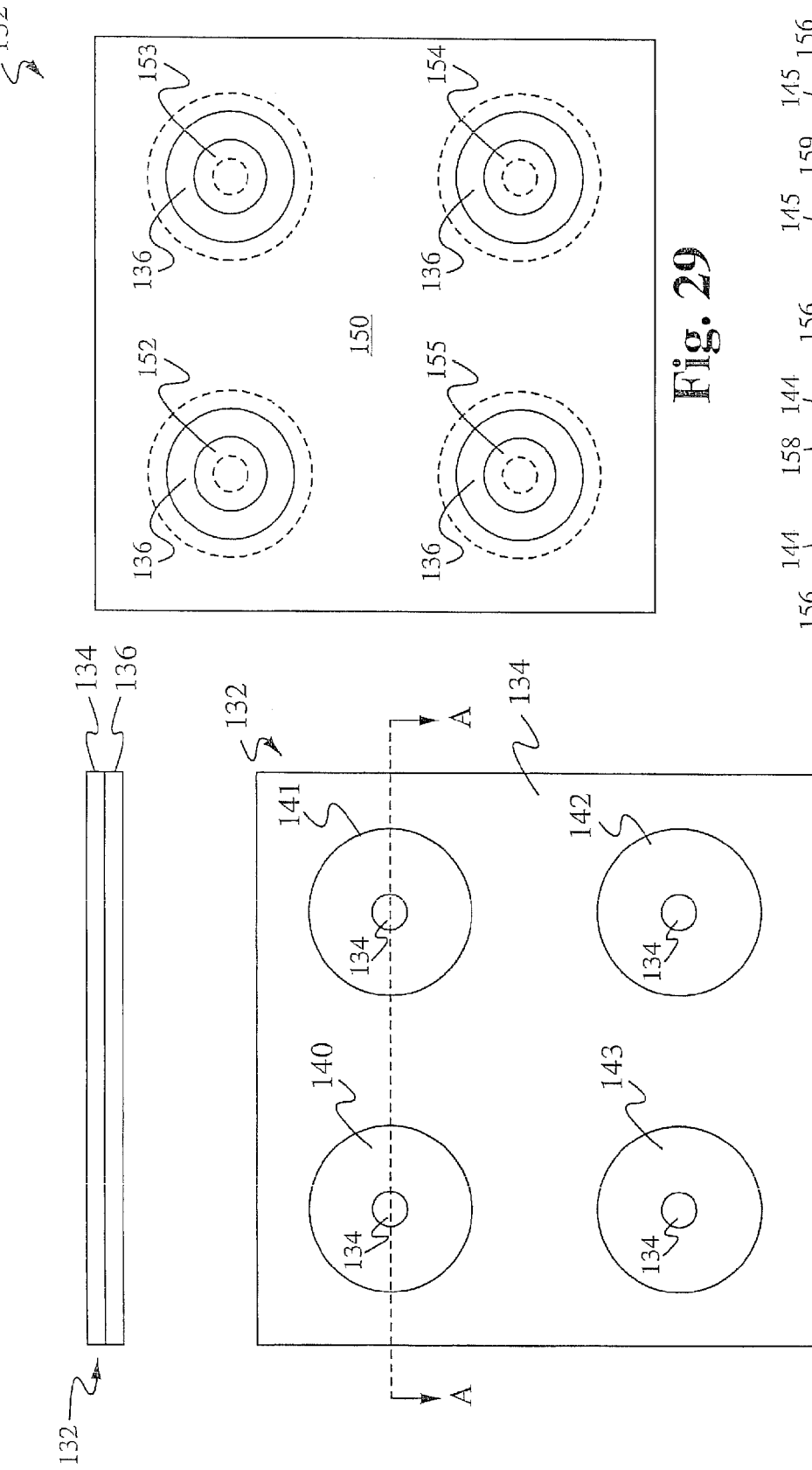
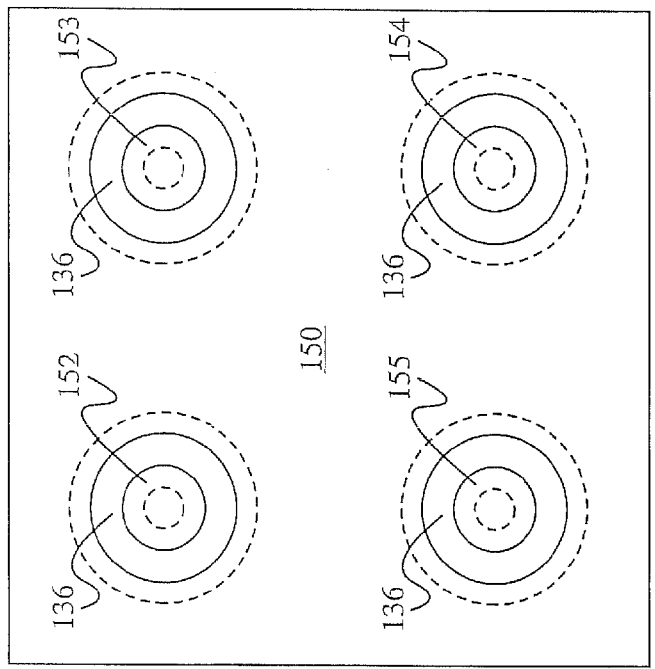
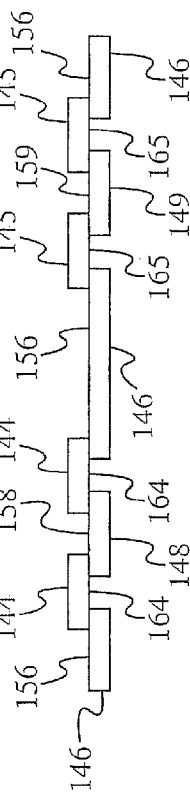
Fig. 28
Fig. 29
Fig. 30

METHOD OF MAKING FUSIBLE LINKS

FIELD OF THE INVENTION

The present invention relates to the field of batteries. More particularly, the present invention relates to the field of batteries and battery packs that use fusible links and methods of fabricating the fusible links.

BACKGROUND OF THE INVENTION

A battery is a device that converts chemical energy to electrical energy. The battery is a combination of one or more electrochemical cells, each cell consists of two half-cells connected in series by a conductive electrolyte. One half-cell includes electrolyte and an electrode to which negatively-charged ions migrate, for example the anode or negative electrode. The other half-cell includes electrolyte and an electrode to which positively-charged ions migrate, for example the cathode or positive electrode. The electrodes do not touch each other but are electrically connected by the electrolyte. Many cells use two half-cells with different electrolytes. In this configuration, each half-cell is separated by a separator. The separator is porous to ions, but not the electrolytes, thereby enabling ions to pass but preventing mixing of the electrolytes between the two half-cells.

A battery pack is a connected set of battery cells. Battery cells can be configured in series, parallel, or a mixture of both to deliver the desired voltage, capacity, or power density. Components of a battery pack include the individual battery cells and the interconnects which provide electrical conductivity between them. In many battery packs, current collector plates are used to collect the current output from each of the battery cells in the battery pack. A first current collector plate is connected to the anodes of each of the battery cells, and a second current collector plate is connected to the cathodes of each of the battery cells.

A fusible link is a type of electrical fuse. At least one electrode of a battery cell is connected to an electrical terminal via a fusible link. The fusible link typically includes a short piece of relatively thin metal wire or strip that melts when excessive current is applied, which interrupts the connection between the battery cell and the electrical terminal. Short circuit, overload, or device failure is often the reason for excessive current. The size and construction of the fusible link is determined so that the heat produced for normal current does not cause the wire to melt and open the circuit.

A method of forming fusible links between battery cell electrodes and an electrical terminal is via a fusible wire bond. The fusible wire bond opens (melts) under excessive current, thereby disabling current flow through the faulted battery cell and electrically isolating the faulted battery cell. When used in a battery pack, the faulted battery cell is isolated from the active battery cells in the battery pack. However, the wire bonds are very fragile and are rigidly attached to the battery cell and a current collector element. Under shock and vibration load, especially that seen in electric vehicles utilizing battery packs, the wire bonds are prone to breakage. One approach is to use adhesive to firmly attach the battery cells to the current collector element to minimize relative motion between the two. This adds manufacturing cost and complexity. Moreover, this approach loses the ability to service individual battery cells since all battery cells are permanently attached to the current collector element and cannot be reworked.

Various welding methods can be used to connect the fusible wire bond to the battery cell electrode and to the current collecting element. Such welding methods include, but are not limited to, ultrasonic welding, resistive welding, and laser welding. Aluminum is a common material used to make a fusible wire bond due to its relatively low electrical resistivity and low melting temperature. However, resistive welding and laser welding are not particularly effective when applied to aluminum. Instead, ultrasonic welding is more effective when applied to aluminum. However, ultrasonic welding equipment is more expensive than equipment used for resistive welding and laser welding. Resistive welding and laser welding are more effective when applied to nickel. However, nickel has a relatively high electrical resistivity and high melting temperature, especially when compared to aluminum, and as such is not particularly effective for use as a fusible wire bond.

SUMMARY OF THE INVENTION

Embodiments of a fusible link include a current collector element, a battery cell conductor pad, and at least one fusible conductor connecting the current collector element and the battery cell conductor pad. The current collector element can be a current collector conductor pad, a current collector conductor pad and a current collector plate, or a fuse sheet. A battery cell has an anode electrode and a cathode electrode, at least one fusible link is coupled to one of the electrodes. The battery cell conductor pad is electrically and mechanically attached to each battery cell electrode to which a fusible link is coupled. The fusible conductor opens under excessive current flow, and has sufficient service loop length to allow relative in-plane and out-of-plane motions between the battery cell electrode and the current collector element. The fusible links can be applied to each of a plurality of battery cells included in a battery pack.

A variety of fabrication techniques can be used to fabricate the fusible link. In some embodiments, a clad foil is used that includes at least a first layer and a second layer. The clad foil is processed to form a first portion that can function as the battery cell conductor pad to be electrically and mechanically coupled to one of the battery cell electrodes, and a second portion that can function as either the current collector conductor pad or the fuse sheet, depending on the particular embodiment of the current collector element. The clad foil is further processed to form a third portion that separates the first portion from the second portion. The third portion of the clad foil is selectively etched to remove the first layer, leaving the second layer that forms the fusible conductor. In the case of an aluminum/nickel clad foil, the nickel layer is etched in the third portion and the remaining aluminum layer in the third portion forms the fusible conductor. A shape of the fusible conductor can be configured during the etching step or during a subsequent stamping step. In some embodiments, the second layer, such as the aluminum layer, in the first portion of the clad foil is selectively etched to form a tab made of the first layer, such as the nickel layer. The material used for this layer is preferably selected according to the welding method to be used to couple tabbed first layer to the battery cell electrode. In some embodiments, the second layer, such as the aluminum layer, in the second portion of the clad foil is selectively etched to form another tab made of the first layer, such as the nickel layer. This tab can be welded to the current collector plate.

In one aspect, a method of fabricating one or more fusible links includes providing a clad foil comprising a first layer and a second layer, wherein the first layer and the second layer are made of different materials; applying one or more masks to the first layer and one or more masks to the second layer;

selectively etching the first layer and the second layer, thereby forming one or more first portions wherein the first layer is removed and the second layer remains, one or more second portions wherein the first layer is removed and the second layer remains, and one or more third portions wherein the second layer is removed and the first layer remains, wherein each third portion couples one of the first portions to one of the second portions, further wherein each first portion forms a first welding pad and each second portion forms a second welding pad; removing the one or more masks from the first layer; removing the one or more masks from the second layer; and forming one or more fusible conductors from each third portion.

In some embodiments, the one or more fusible conductors are formed by performing a stamping step or a cutting step on each third portion after the one or more masks are removed from the first layer. In other embodiments, the one or more fusible conductors are formed by etching during the selective etching of the first layer, further wherein the one or more masks applied to the first layer are configured to form the one or more fusible conductors. In some embodiments, the first layer and the second layer are selectively etched using a single-step etching process. In other embodiments, the first layer and the second layer are selectively etched using a two-step etching process, further wherein during a first etching step of the two-step etching process a first etchant is used that etches the first layer but not the second layer, and during a second etching step of the two-step etching process a second etchant is used that etches the second layer but not the first layer. In some embodiments, the clad foil is formed into a single fusible link comprising one first welding pad that forms a battery cell electrode pad, one second welding pad that forms a current collector conductor pad, and one or more fusible conductors coupling the one first welding pad to the one second welding pad. In other embodiments, the clad foil is formed into a fuse sheet having an array of fusible links, each fusible link for coupling to one battery cell electrode of a battery pack. In some embodiments, each third portion is coupled to one of the first welding pads via a first clad foil portion that includes both the first layer and the second layer, and each third portion is coupled to one of the second welding pads via a second clad foil portion that includes both the first layer and the second layer. The second layer has a higher melting temperature and a higher electrical resistivity than the first layer. In some embodiments, the first layer comprises aluminum and the second layer comprises nickel. In some embodiments, each first welding pad comprises a battery cell conductor pad, and each second welding pad comprises a current collector element. In some embodiments, the one or more first welding tabs are welded to battery cell electrodes and the one or more second welding tabs are welded to a current collector plate or to an electrical terminal using resistive welding or laser welding. In some embodiments, the one or more masks applied to the first layer and the one or more masks applied to the second layer are physical masks. In other embodiments, the one or more masks applied to the first layer and the one or more masks applied to the second layer are applied using photolithography. Each fusible conductor opens when a current flow through the fusible conductor reaches a threshold current.

In another aspect, a method of fabricating a fusible link assembly includes fabricating a fusible link having one or more first welding tabs and welding each of the one or more first welding tabs to a corresponding one battery cell electrode. Fabricating the fusible link includes providing a clad foil comprising a first layer and a second layer, wherein the first layer and the second layer are made of different materials; applying one or more masks to the first layer and one or more masks to the second layer; selectively etching the first layer and the second layer, thereby forming one or more first portions wherein the first layer is removed and the second layer remains, one or more second portions wherein the first layer is removed and the second layer remains, and one or more third portions wherein the second layer is removed and the first layer remains, wherein each third portion couples one of the first portions to one of the second portions, further wherein each first portion forms a first welding pad and each second portion forms a second welding pad; removing the one or more masks from the first layer; removing the one or more masks from the second layer; and forming one or more fusible conductors from each third portion.

BRIEF DESCRIPTION OF THE DRAWINGS

FIG. 28 illustrates a top down view of a sheet of clad foil and masks applied to an aluminum layer.

FIG. 29 illustrates a bottom up view of the sheet of clad foil and masks applied to a nickel layer.

FIG. 30 illustrates a cut out side view of the etched clad foil along the line A-A in FIG. 28 after the two-step etching process or the single step etching process is performed and the masks are removed.

Figure 1:
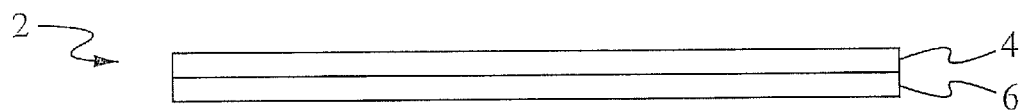
FIG. 1 illustrates a cut out side view of a clad foil according to an embodiment.

Embodiments of the fusible link and methods of fabricating thereof are described relative to the several views of the drawings. Where appropriate and only where identical elements are disclosed and shown in more than one drawing, the same reference numeral will be used to represent such identical elements.

DETAILED DESCRIPTION OF THE EMBODIMENTS

Embodiments of the present application are directed to a fusible link and methods of fabricating thereof. Those of ordinary skill in the art will realize that the following detailed description of the fusible link and fabrication methods are illustrative only and is not intended to be in any way limiting. Other embodiments of the fusible link and fabrication methods will readily suggest themselves to such skilled persons having the benefit of this disclosure.

Reference will now be made in detail to implementations of the fusible link and fabrication methods as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the fusible link are directed to a battery cell conductor pad, a current collector, and at least one fusible conductor connecting the battery cell conductor pad and the current collector. A battery cell includes an anode electrode and a cathode electrode. In some embodiments, the battery cell is secured within a battery cell holder having at least a first opening for access to the anode electrode and a second opening for access to the cathode electrode. In some embodiments, a fusible link is coupled to one of the battery cell electrodes, while a non-fusible link is coupled to the other electrode. In other embodiments, a first fusible link is coupled to the anode electrode, and a second fusible link is coupled to the cathode electrode. A fusible link has a battery cell conductor pad electrically and mechanically coupled to the battery cell electrode. In some embodiments, the current collector is a current collector conductor pad. In some embodiments, the current collector conductor pad is mechanically coupled to the battery cell holder. A current collector conductor pad is coupled to the battery cell holder adjacent to the opening at the corresponding battery cell electrode.

In other embodiments, the current collector includes a current collector plate and current collector conductor pad. In some embodiments, the current collector plate is mechanically coupled to the battery cell holder. The current collector plate has at least one plate opening aligned with an opening in the battery cell holder and one of the electrodes of the battery cell. If a second fusible link having a current collector plate is coupled to the other electrode, then another current collector plate has at least one plate opening aligned with an opening in the battery cell holder and the other electrode of the battery cell. In this embodiment, the current collector conductor pad is electrically and mechanically coupled to the current collector plate. The current collector conductor pad is coupled to the current collector plate adjacent to the current collector plate opening at the battery cell electrode. In an exemplary configuration, the battery cell has a cylindrical shape, the current collector conductor pad has a ring shape and the battery cell conductor pad has a circular shape, and the current collector conductor pad, the battery cell conductor pad, and the battery cell are concentric.

At least one fusible conductor is coupled between the current collector conductor pad and the battery cell conductor pad. Current flows between the battery cell conductor pad and the current collector conductor pad through the fusible conductor. Each fusible conductor melts, and thereby opens, under excessive current flow. In this manner, the fusible conductor functions as a fuse and stops current flow into and out of the battery cell.

In some embodiments, multiple battery cells are electrically connected as a battery pack. The battery pack includes a plurality of battery cells, a battery cell holder, and a plurality of fusible links, at least one fusible link coupled to at least one electrode of each battery cell in the battery pack. In some embodiments, at least one current collector plate is coupled to first electrodes of the plurality of battery cells. In some embodiments, the current collector conductor pads are coupled to the current collector plate. In other embodiments, a first fuse sheet is coupled to the current collector plate. The fuse sheet replaces all current collector conductor pads. The fuse sheet is a conductive sheet with the fusible conductors arranged into an array. The first end of each fusible conductor is integrally formed with the fuse sheet and the second end of each fusible link forms the battery cell conductor pad, which is coupled to the battery cell electrode.

Various welding methods can be used to connect a battery cell conductor pad to a battery cell electrode, to connect a current collector conductor pad to an electrical lead, to connect current collector conductor pads to a current collector plate, and to connect a fuse sheet to a current collector plate. Such welding methods include, but are not limited to, ultrasonic welding, resistive welding, and laser welding. The specific type of welding method used is dependent in part upon the type of materials being welded. In some embodiments, the battery cell housing including the battery cell electrodes are made of Ni-plated Fe (iron or steel) and the fusible link is made of Al (aluminum). Resistive welding and laser welding are not particularly effective when applied to aluminum. In this case, ultrasonic welding is more effective. However, ultrasonic welding equipment is more expensive than equipment used for resistive welding and laser welding. Resistive welding and laser welding are more effective when applied to nickel. However, nickel has a higher resistivity and a higher melting temperature than aluminum, and as such is not particularly effective for use as a fusible link.

A clad foil has a first layer of one metal bonded to a second layer of a different metal. In some embodiments, a clad foil includes a nickel layer bonded to an aluminum layer. Such a clad foil can be processed to form nickel tabs and aluminum fusible conductors, which are used as, or part of, the fusible link. Resistive welding or laser welding can bed used to appropriately weld the fusible link at the nickel tabs.

Methods of fabricating the fusible link are directed to processing a multi-layer clad foil having at least a first layer suitable for forming a fusible link and a second layer suitable for forming one or more welding pads. In some embodiments, the first layer is an aluminum layer and the second layer is a nickel layer. A two-step etching process or a single step etching process is performed on the clad foil to form an etched clad foil having a first nickel only portion that forms one or more nickel pads used as current collector conductor pads, a second nickel only portion that forms one or more nickel pads used as battery cell conductor pads, and an aluminum only portion that forms aluminum conductors. The aluminum conductors are shaped and sized to form aluminum fusible conductors. In some embodiments, the aluminum conductors are formed into aluminum fusible conductors using a stamping process. In other embodiments, the aluminum fusible conductors are formed during the etching process. In this alternative case, masks specific to the fusible conductor shapes and sizes are used. The method of fabricating can be applied to form a single fusible link or to form an array of fusible links.

Figure 2:
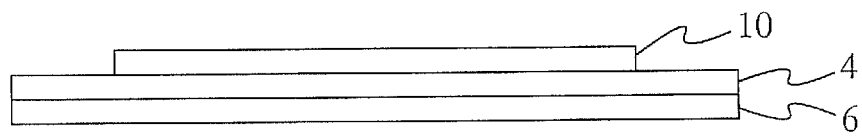
FIG. 2 illustrates a mask applied to the clad foil of FIG. 1.
Figure 3:
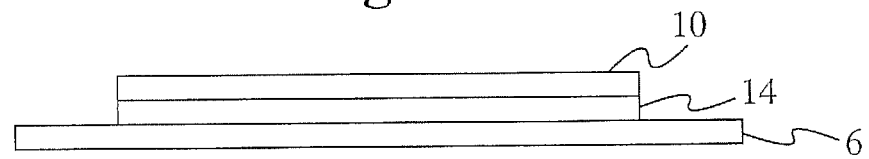
FIG. 3 illustrates the clad foil and mask of FIG. 2 after a first etching step is performed.
Figure 4:
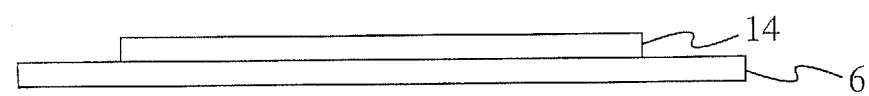
FIG. 4 illustrates the clad foil of FIG. 3 after the mask is removed.
Figure 5:
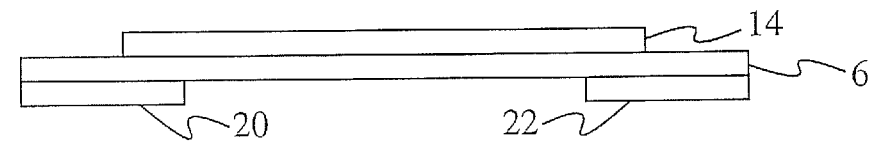
FIG. 5 illustrates a mask applied to the clad foil of FIG. 4.
Figure 6:
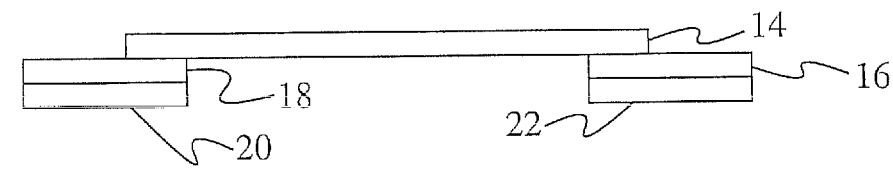
FIG. 6 illustrates the clad foil and mask of FIG. 5 after a second etching step is performed.

FIG. 1 illustrates a cut out side view of a clad foil according to an embodiment. The clad foil 2 includes an aluminum layer 4 and a nickel layer 6. In FIG. 2, a mask 10 is applied to the aluminum layer 4. The mask 10 can be a physical mask or the mask 10 can be applied using photolithography. A first etching step is performed using an etchant that etches aluminum but does not etch nickel, thereby forming an etched aluminum layer 14, as shown in FIG. 3. The mask 10 is removed, as in FIG. 4. In FIG. 5, a mask 20 and a mask 22 are applied to the nickel layer 6. The masks 20 and 22 can be physical masks or the masks 20 and 22 can be applied using photolithography. A second etching step is performed using an etchant that etches nickel but does not etch aluminum, thereby forming etched nickel layers 16 and 18, as shown in FIG. 6. The masks 20 and 22 are removed, as in FIG. 7. In other embodiments, the mask 10 is not removed prior to the second etching step. Instead, the mask 10 remains in place during the second etching step, after which the masks 10, 20, and 22 are removed. The result is a fusible link 12 including the nickel layer 16 and the nickel layer 18 thermally and mechanically coupled via the aluminum layer 14. A portion of the nickel layer 16 overlaps with a portion of the aluminum layer 14. A remaining portion of the nickel layer 16 where the aluminum has been removed forms a nickel tab 26. Similarly, a portion of the nickel layer 18 overlaps with a portion of the aluminum layer 14. A remaining portion of the nickel layer 18 where the aluminum has been removed forms a nickel tab 28. A remaining portion of the aluminum layer 14 where the nickel has been removed forms an aluminum conductor 24. In some embodiments, the nickel tab 28 forms a battery cell conductor pad to be coupled to a battery cell electrode, and the nickel tab 26 forms a current collector conductor tab to be coupled to an electrical terminal.

Figure 8:
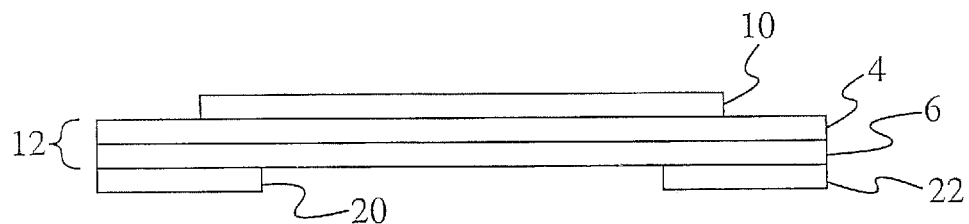
FIG. 8 illustrates the application of all the masks to the clad foil of FIG. 1.
Figure 9:
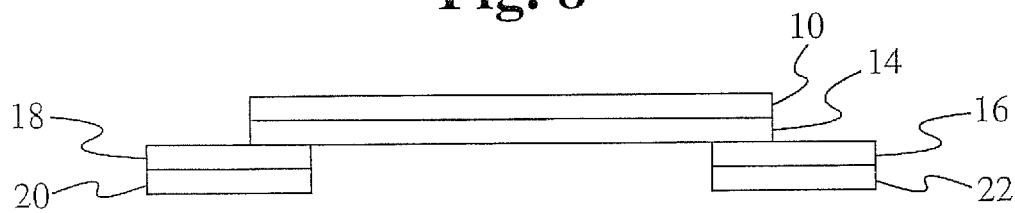
FIG. 9 illustrates the clad foil and masks of FIG. 8 after a single-step etching process is performed.

In other embodiments, a single etching step is performed instead of a separate first etching step and second etching step. FIG. 8 illustrates the application of all the masks 10, 20, and 22 to the clad foil 12. A single etching step is performed using an etchant that etches both aluminum and nickel, thereby forming the etched aluminum layer 14 and the etched nickel layers 16 and 18, as shown in FIG. 9. The masks 10, 20, and 22 are removed after the single etching step.

Figure 7:
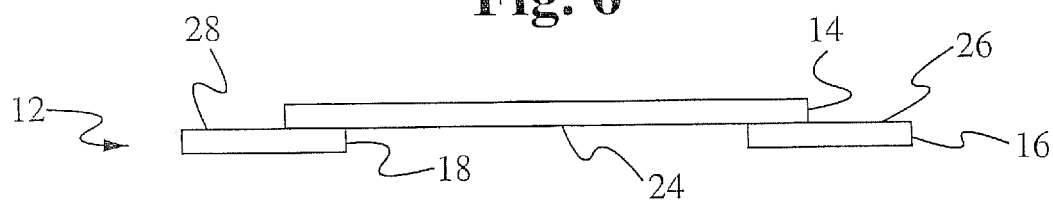
FIG. 7 illustrates the clad foil of FIG. 6 after the mask is removed.
Figure 10:
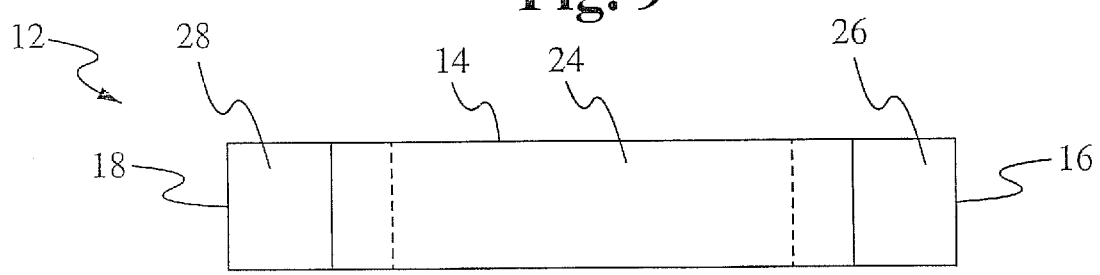
FIG. 10 illustrates a top down view of the fusible link of FIG. 7.
Figure 11:
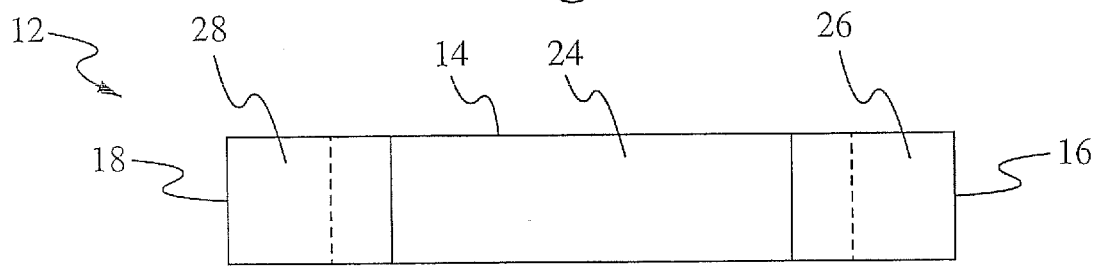
FIG. 11 illustrates a bottom up view of the fusible link of FIG. 7.
Figure 12:
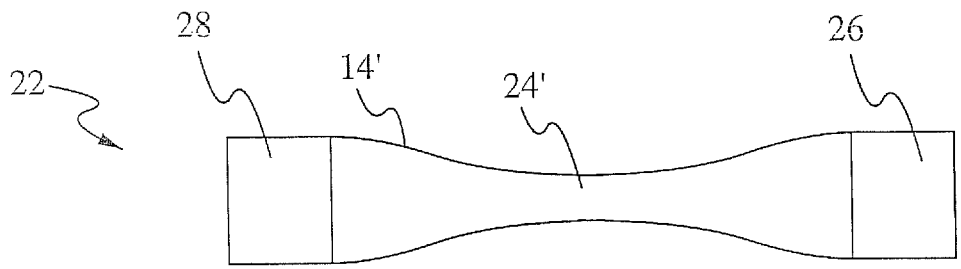
FIG. 12 illustrates a top down view of a fusible link fabricated with a narrower aluminum conductor than the aluminum conductor of FIG. 10.

FIG. 10 illustrates a top down view of the fusible link 12 of FIG. 7. FIG. 11 illustrates a bottom up view of the fusible link 12 of FIG. 7. In the exemplary configuration of FIGS. 10 and 11, the fusible link 12 forms a strip with the nickel tab 28 on one end of the strip and the nickel tab 26 on the other end of the strip. In this case, the original clad foil 2 shown in FIG. 1 is a strip. As shown in FIGS. 10 and 11, a width of the aluminum conductor 24 is the same as the width of the nickel tabs 26 and 28. Depending on the dimensions of the clad foil strip 2 (FIG. 1) and the normal current that is to be passed through the fusible link 12 during operation, the shape and/or dimensions of the aluminum conductor 24 may or may not be sufficient for functioning as a fusible conductor. The shape and/or dimensions of the aluminum conductor 24 can be customized to the application. For example, the aluminum conductor can be narrowed relative to the aluminum conductor 24 shown in FIGS. 10 and 11. FIG. 12 illustrates a top down view of a fusible link 22 fabricated with a narrower aluminum conductor 24' than the aluminum conductor 24 of FIG. 10. In some embodiments, the fusible link 22 is fabricated by performing a stamping step on the aluminum conductor 24 of the fusible link 12. In other embodiments, the aluminum conductor 24' is formed by etching during the aluminum etching step shown in FIG. 3 or 9. In this case, the mask 10 is replaced by a mask configured to form the aluminum conductor 24' in FIG. 12. It is understood that the shape, size, and orientation of the aluminum conductor can be different than that shown in FIGS. 11 and 12.

The fabrication methods described above are applied to a clad foil that either starts as a strip of clad foil, similar in configuration to the fusible link 12 shown in FIGS. 10 and 11, or starts as a larger piece of clad foil that is eventually formed into a strip, such as using cutting, etching or other conventional methods. Alternatively configured fusible links are also contemplated.

Figure 13:
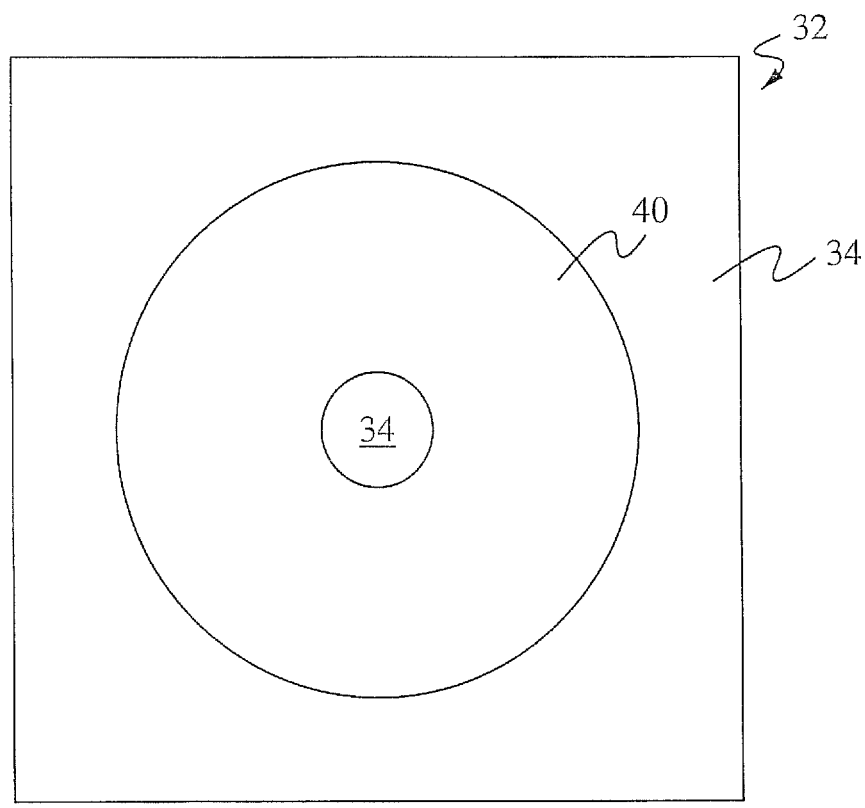
FIG. 13 illustrates a top down view of a sheet of clad foil and a mask.
Figure 14:
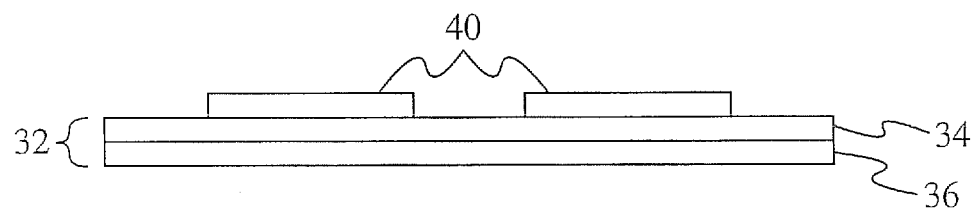
FIG. 14 illustrates a cut out side view of the clad foil sheet and mask of FIG. 13.

In some embodiments, a fusible link is formed from a sheet of clad foil that is larger than the strip of clad foil used in FIGS. 1-12. FIG. 13 illustrates a top down view of a sheet of clad foil 32. The clad foil 32 includes an aluminum layer 34 and a nickel layer 36, as shown in the cut out side view of FIG. 14. A mask 40 is applied to the aluminum layer 34. As shown in FIG. 14, the mask 40 is ring-shaped. In other embodiments, the mask is alternatively shaped. In general, the mask 40 is shaped to form an aluminum fusible conductor or an intermediate aluminum conductor that can be subsequently formed into an aluminum fusible conductor, such as via a stamping step applied to the intermediate aluminum conductor.

Figure 15:
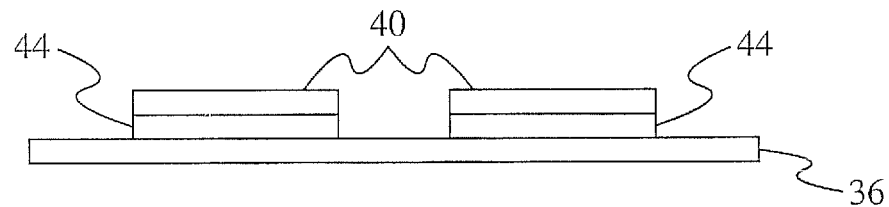
FIG. 15 illustrates the clad foil sheet and mask of FIG. 14 after a first etching step is performed.
Figure 16:
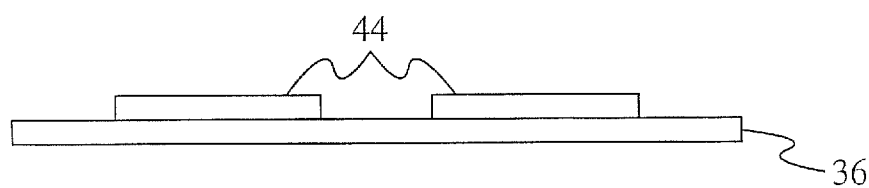
FIG. 16 illustrates the clad foil sheet of FIG. 15 after the mask is removed.
Figure 17:
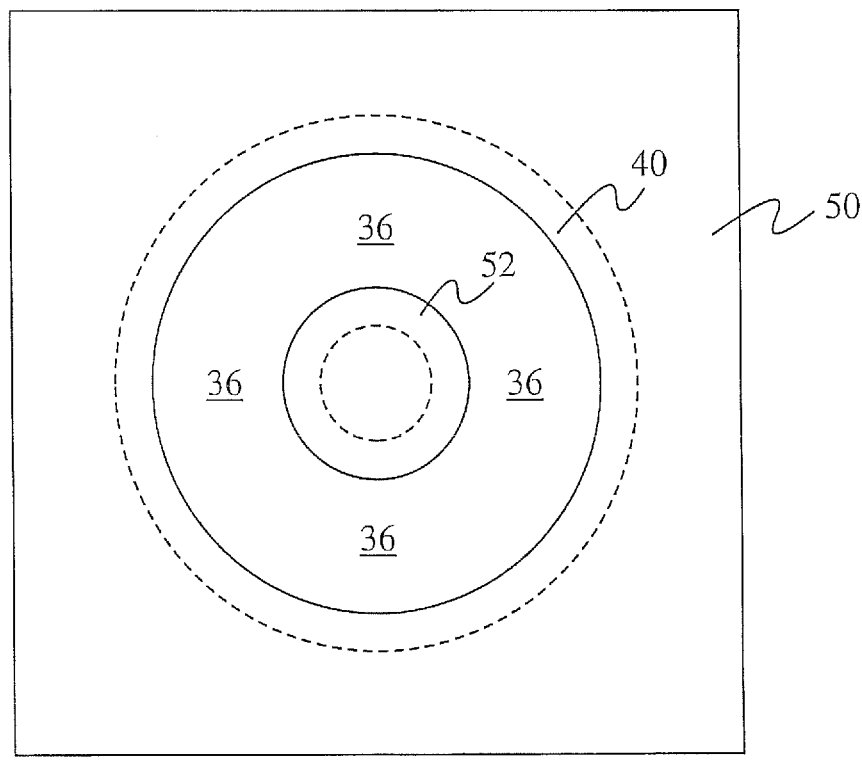
FIG. 17 illustrates a bottom up view of the sheet of clad foil and a mask.
Figure 18:
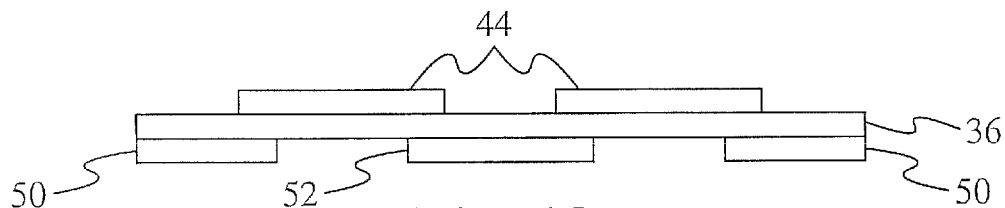
FIG. 18 illustrates a cut out side view of the clad foil sheet and mask of FIG. 17.
Figure 19:
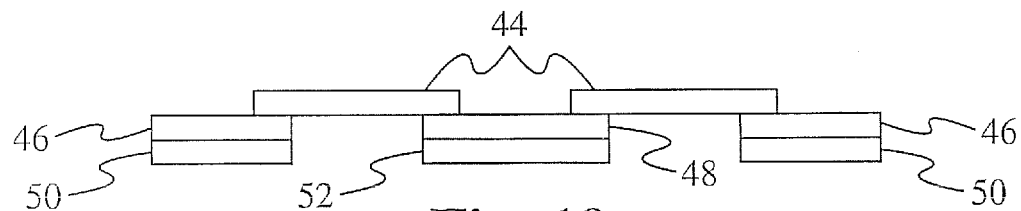
FIG. 19 illustrates the clad foil sheet and mask of FIG. 18 after a second etching step is performed.
Figure 20:
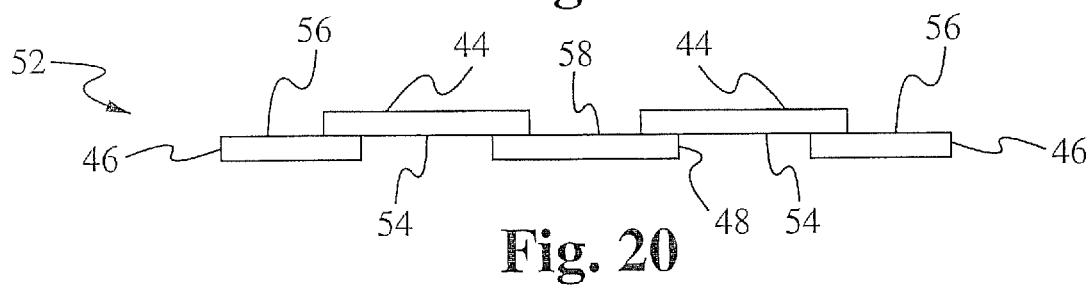
FIG. 20 illustrates the clad foil sheet of FIG. 19 after the mask is removed.
Figure 21:
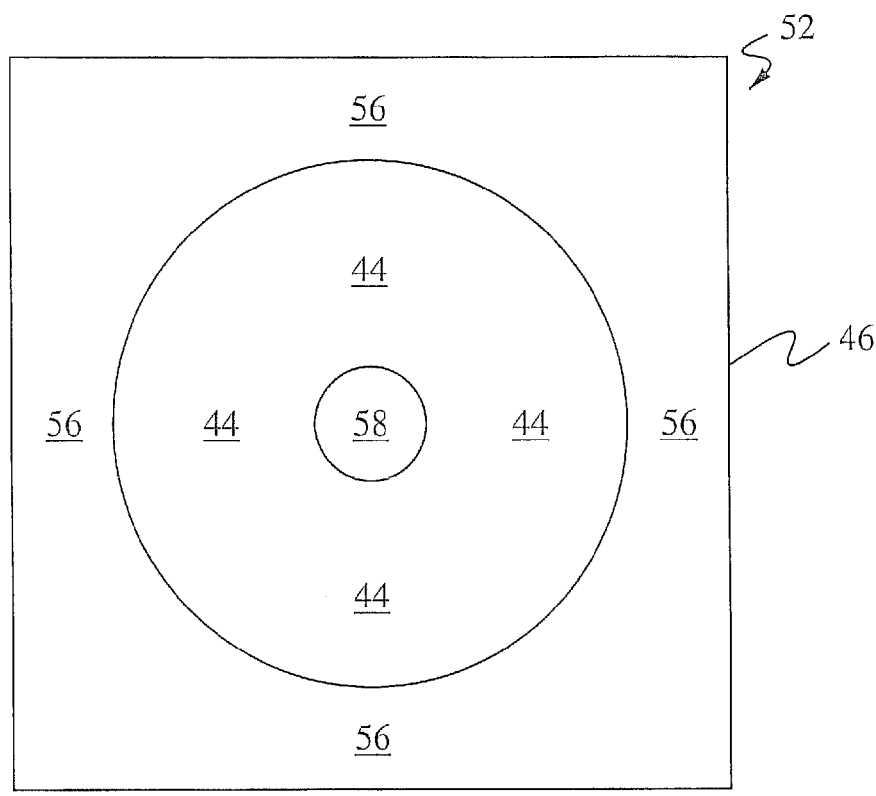
FIG. 21 illustrates a top down view of the fusible link of FIG. 20.

A first etching step is performed using an etchant that etches aluminum but does not etch nickel, thereby forming an etched aluminum layer 44, as shown in FIG. 15. The mask 40 is removed, as in FIG. 16. In FIG. 17, a mask 50 and a mask 52 are applied to the nickel layer 36. FIG. 17 illustrates a bottom up view of the nickel layer 36 of FIG. 16. The dotted lines indicate the relative position of the aluminum layer 44 of FIG. 16. FIG. 18 illustrates a cut out side view of the structure of FIG. 17. A second etching step is performed using an etchant that etches nickel but does not etch aluminum, thereby forming etched nickel layers 46 and 48, as shown in FIG. 19. The masks 50 and 52 are removed, as in FIG. 20. In other embodiments, the mask 40 is not removed prior to the second etching step. Instead, the mask 40 remains in place during the second etching step, after which the masks 40, 50, and 52 are removed. The result is a fusible link 52 including the nickel layer 46 and the nickel layer 48 thermally and mechanically coupled via the aluminum layer 44. A portion of the nickel layer 46 overlaps with a portion of the aluminum layer 44. A remaining portion of the nickel layer 46 where the aluminum has been removed forms a nickel tab 56. FIG. 21 illustrates a top down view of the fusible link 52 of FIG. 20. In the embodiment shown in FIGS. 17-21, the nickel tab 56 is surrounds the ring-shaped aluminum layer 44. Similarly, a portion of the nickel layer 48 overlaps with a portion of the aluminum layer 44. A remaining portion of the nickel layer 48 where the aluminum has been removed forms a nickel tab 48. In the embodiment shown in FIGS. 17-21, the nickel tab 58 is a circle formed in the center hole of the aluminum layer 44. A remaining portion of the aluminum layer 44 where the nickel has been removed forms an aluminum conductor 54. In some embodiments, the nickel tab 58 forms a battery cell conductor pad to be coupled to a battery cell electrode, and the nickel tab 56 forms a current collector conductor tab to be coupled to an electrical terminal.

In other embodiments, a single etching step is performed instead of a separate first etching step and second etching step. For example, all the masks 40, 50, and 52 are applied to the clad foil 52. A single etching step is performed using an etchant that etches both aluminum and nickel, thereby forming the etched aluminum layer 44 and the etched nickel layers 46 and 48. The masks 40, 50, and 52 are removed after the single etching step.

Figure 22:
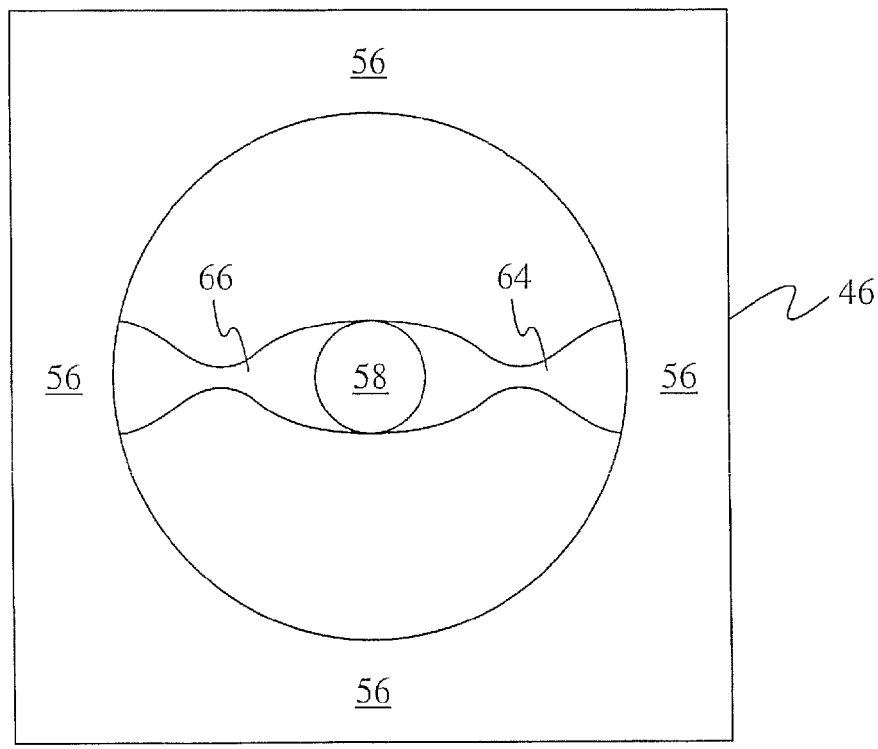
FIG. 22 illustrates a top down view of the fusible link of FIG. 21 after a stamping step has been applied.
Figure 23:
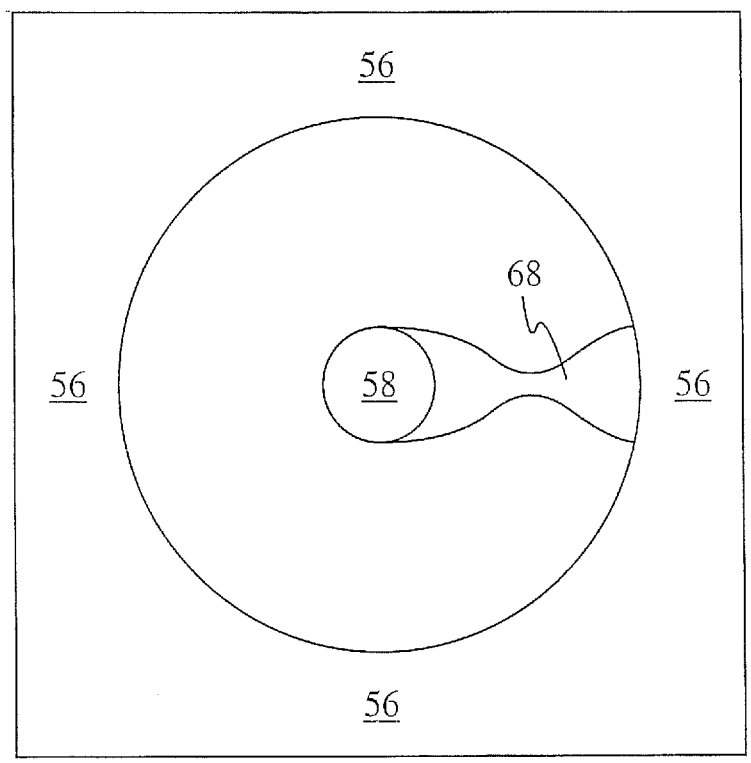
FIG. 23 illustrates an alternative configuration in which the stamping process forms a single aluminum fusible conductor.

The aluminum conductor 54 is processed to form an aluminum fusible conductor having application-specific shapes and sizes. In some embodiments, a stamping step is applied to the aluminum conductor 54 to form the aluminum fusible conductor. FIG. 22 illustrates a top down view of the fusible link 52 of FIG. 21 after a stamping step has been applied. In some embodiments, the stamping step is applied only to the aluminum conductor 54 of the aluminum layer 44. In other embodiments, the stamping step is applied to the aluminum layer 44, including the portion of the aluminum layer that forms the aluminum conductor 54, and the portions of the aluminum layer that overlap with the nickel layer 46 and/or the nickel layer 48. In this case, any portion of the nickel layers 46 and 48 that overlap with a stamped portion of the aluminum layer 44 are also stamped. The stamping process forms an aluminum fusible conductor. In the exemplary configuration shown in FIG. 22, the stamping process forms two aluminum fusible conductors 64 and 66. FIG. 23 illustrates an alternative configuration in which the stamping process forms a single aluminum fusible conductor 68.

In other embodiments, the aluminum fusible conductor(s) are formed by etching during the aluminum etching step shown in FIG. 15. In this case, the mask 40 is replaced by a mask configured to form the aluminum fusible conductor(s), such as the aluminum fusible conductors 64 and 66 in FIG. 22 or the aluminum fusible conductor 68 in FIG. 23.

Figure 24:
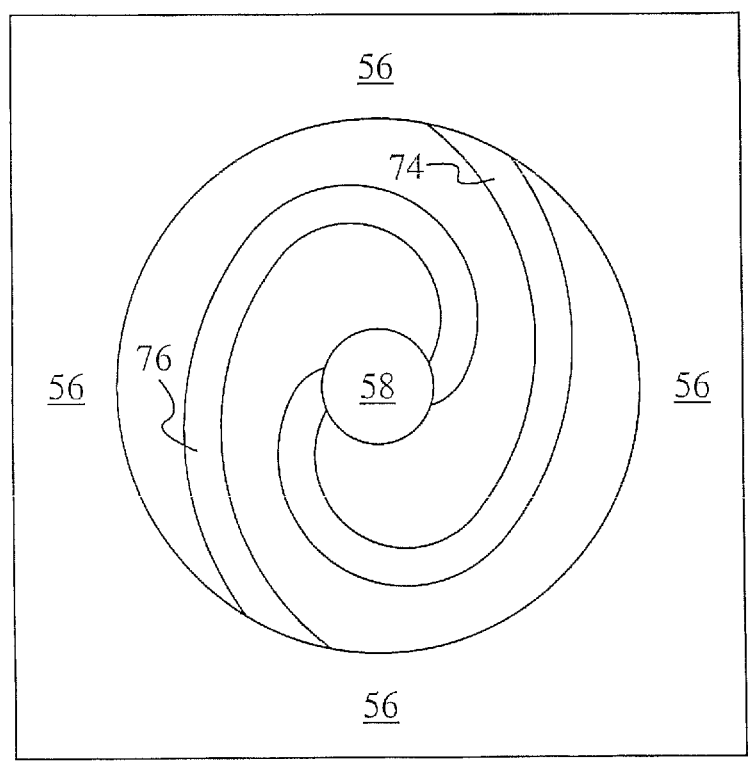
FIG. 24 illustrates a top down view of a fusible link where the aluminum layer including the aluminum conductor is processed to form aluminum flexible fusible conductors.

The shapes and dimensions of the aluminum fusible conductors can be alternatively configured. FIG. 24 illustrates a top down view of a fusible link where the aluminum layer including the aluminum conductor is processed to form aluminum flexible fusible conductors 74 and 76. The flexible fusible conductors 74 and 76 are configured to allow relative movement of a battery cell electrode coupled to the aluminum tab 58 and a current collector element coupled to the nickel tab 56. An example of such a flexible fusible conductor is described in U.S. patent application Ser. No. 12/779,884, filed on May 13, 2010, and titled "Flexible Fusible link, Systems, and Methods", which is hereby incorporated in its entirety by reference.

Figure 25:
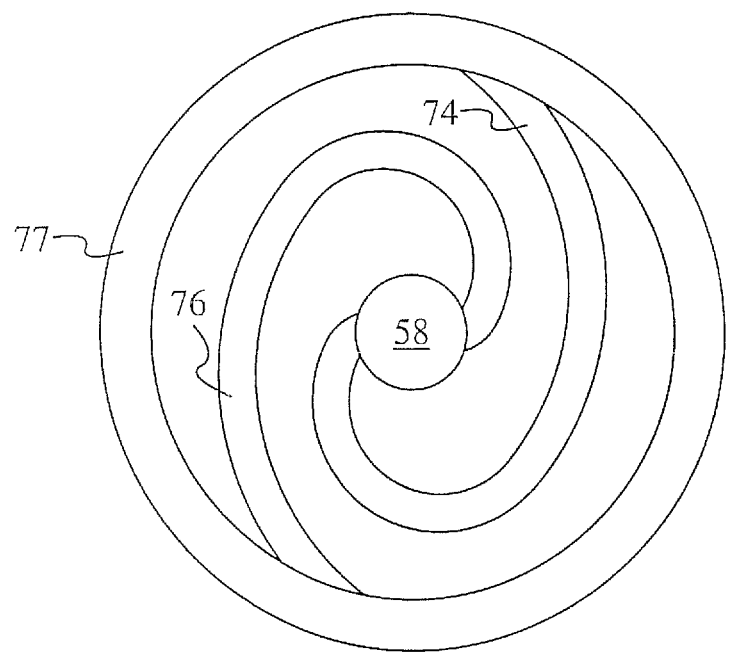
FIG. 25 illustrates a top down view of a fusible link that is similar to the fusible link of FIG. 24 except that the outer nickel tab of FIG. 24 is alternatively configured as a ring-shaped nickel tab.

The shapes and dimensions of the nickel tabs can also be alternatively configured. FIG. 25 illustrates a top down view of a fusible link that is similar to the fusible link of FIG. 24 except that the nickel tab 56 of FIG. 24 is alternatively configured as a ring-shaped nickel tab 78. The nickel tabs can be alternatively shaped during the etching steps and/or during the stamping step. In general, it is understood that the numbers, shapes, and dimensions of the aluminum fusible conductors, as well as the numbers, shapes, and dimensions of the nickel tabs shown in FIGS. 22-25 are for exemplary purposes only and that alternative configurations are contemplated.

Figure 26:
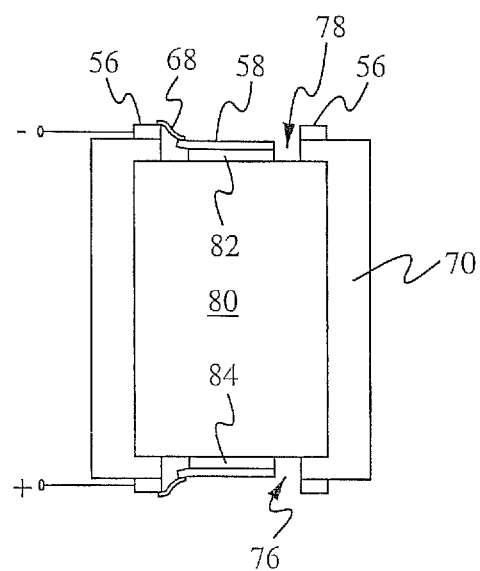
FIG. 26 illustrates a cut out side view of a fusible link assembly according to a first embodiment.

The fabricated fusible link is used to electrically and mechanically couple an electrode of a battery cell to an electrical terminal. In some embodiments, the nickel tab that functions as the current collector conductor tab serves as a current collecting element that is coupled to the electrical terminal. FIG. 26 illustrates a cut out side view of a fusible link assembly according to a first embodiment. The fusible link assembly includes a battery cell 80 positioned within a battery cell holder 70. The battery cell 80 has a first electrode 82 and a second electrode 84. In an exemplary configuration, the first electrode 82 is an anode electrode and the second electrode 84 is a cathode electrode. In some embodiments, the battery cell holder 70 includes a battery cell chamber have a form factor suitable for accommodating a battery cell within. The form factor of the battery cell chamber is form fitting to the battery cell so as to minimize or prevent movement of the battery cell relative to the battery cell holder. The battery cell holder 70 includes an opening 78 and an opening 76. The openings 76 and 78 are aligned with the battery cell chamber, and in particular are aligned with the anode electrode 82 and the cathode electrode 84 of the battery cell 80 positioned within the battery cell chamber. In some embodiments, the battery cell holder 70 is made of an electrically resistant and thermally conductive material. In some embodiments, one or more of the side surfaces of the battery cell holder 70 are configured so as to enable access to the battery cell chamber for repair or replacement of a battery cell. For example, one or more sides of the battery cell holder are panels that are attached using screws, latches, or hinges.

In some embodiments, a fusible link is coupled to each of the battery cell electrode. In other embodiments, a fusible link is coupled to one of the battery cell electrodes and a non-fusible conductor is coupled to the other battery cell electrode. FIG. 26 illustrates the exemplary case where a fusible link is coupled to each of the battery cell electrodes. A first fusible link is coupled to the battery cell holder 70 and to the anode electrode 82 of the battery cell 80. A second fusible link is coupled to the battery cell holder 70 and to the cathode electrode 84 of the battery cell 80. In an exemplary configuration, the fusible links are each configured as the fusible link of FIG. 23. In this configuration, each fusible link includes the nickel tab 58, which functions as a battery cell conductor pad, the aluminum fusible conductor 68, and the nickel tab 56, which functions as a current collector conductor pad. The battery cell conductor pad of the first fusible link is electrically and mechanically coupled to the anode electrode 82. The current collector conductor pad is mechanically coupled to the surface of the battery cell holder 70. The current collector conductor pad is positioned proximate an opening 78 in the battery cell holder 70. In the exemplary configuration where the current collector conductor pad has a circular inner perimeter, as shown in FIG. 22, the current collector conductor pad is positioned around the opening 78.

The battery cell conductor pad of the second fusible link is electrically and mechanically coupled to the cathode electrode 84. The current collector conductor pad of the second fusible link is mechanically coupled to a surface of the battery cell holder 70. The current collector conductor pad is positioned proximate the opening 76 in the battery cell holder 70. In the exemplary configuration where the current collector conductor pad 44 has a circular inner perimeter, as shown in FIG. 22, the current collector conductor pad is positioned around the opening 76. The current collector conductor pad of the first fusible link is coupled to an electrical lead to form a negative terminal and the current collector conductor pad of the second fusible link is coupled to an electrical lead to form a positive terminal. The positive and negative terminals can be coupled to external components.

Various methods can be used to connect a battery cell conductor pad to a battery cell electrode. Methods for connecting a battery cell conductor pad to a battery cell electrode include, but are not limited to, resistance welding, laser welding, ultrasonic welding, mechanical fasteners, and conductive adhesives. Various method can be used to connect a current collector conductor pad to the battery cell holder. Methods for connecting a current collector conductor pad to a battery cell holder include, but are not limited to, adhesives, mechanical fasteners, and welding. As applied to the fusible link, the nickel tabs functioning as the battery cell conductor pad and the current collector conductor pad are particularly amenable to resistive welding and laser welding.

Figure 27:
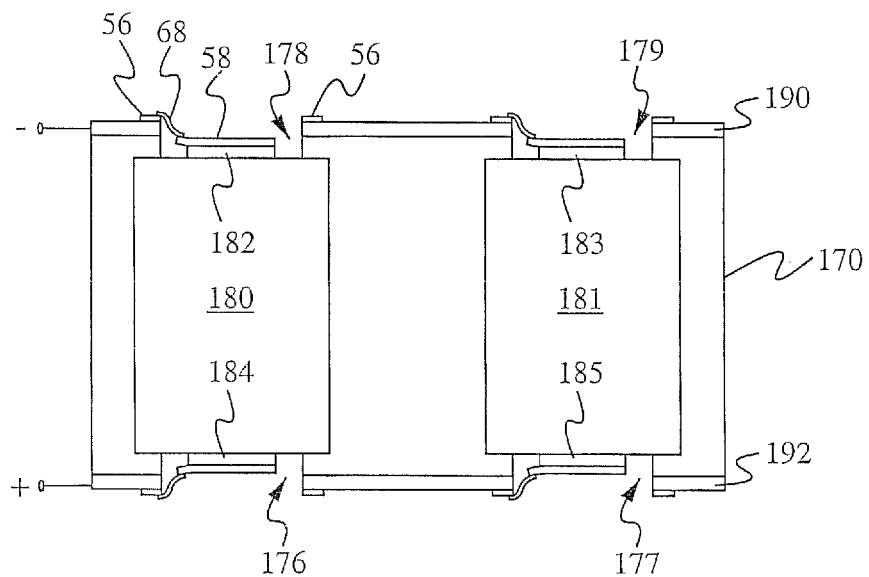
FIG. 27 illustrates a cut out side view of a battery pack including a plurality of fusible links according to a first embodiment.

In other embodiments, the current collector conductor tab is coupled to an additional current collecting element, such as a current collecting plate, which in turn is coupled to an electrical terminal. A current collecting plate is used to collect current from a plurality of battery cells, such as in a battery pack. FIG. 27 illustrates a cut out side view of a battery pack including a plurality of fusible links according to a first embodiment. For simplicity, FIG. 27 shows an exemplary configuration including two battery cells. It is understood that the concepts can be expanded to more than two battery cells.

The battery pack includes battery cells 180 and 181 positioned within a battery cell holder 170. The battery cell 180 has a first electrode 182 and a second electrode 184, and the battery cell 181 has a first electrode 183 and a second electrode 185. In an exemplary configuration, the first electrodes 182 and 183 are anode electrodes and the second electrodes 184 and 185 are cathode electrodes. In some embodiments, the battery cell holder 170 includes a plurality of battery cell chambers each having a form factor suitable for accommodating a battery cell within. The form factor of the battery cell chamber is form fitting to the battery cell so as to minimize or prevent movement of the battery cell relative to the battery cell holder. The battery cell holder 170 includes openings 176, 177, 178, and 179. The openings 176 and 178 are aligned with a first battery cell chamber, and in particular are aligned with the cathode electrode 184 and the anode electrode 182 of the battery cell 180 positioned within the first battery cell chamber. The openings 177 and 179 are aligned with a second battery cell chamber, and in particular are aligned with the cathode electrode 185 and the anode electrode 183 of the battery cell 181 positioned within the second battery cell chamber. In some embodiments, the battery cell holder 170 is made of an electrically resistant and thermally conductive material. In some embodiments, one or more of the side surfaces of the battery cell holder 170 are configured so as to enable access to the battery cell chambers for repair or replacement of a battery cell. For example, one or more sides of the battery cell holder are panels that are attached using screws, latches, or hinges.

The battery pack further includes a first current collector plate 190 and a second current collector plate 192 each coupled to the battery cell holder 170. Each current collector plate has a plurality of through-holes that are aligned with corresponding openings in the battery cell holder 170. As shown in FIG. 27, the current collector plate 190 has through-holes aligned with each of the openings 178 and 179 in the battery cell holder 170, and the current collector plate 192 has through-holes aligned with each of the openings 176 and 177 in the battery cell holder 170. As such, the number of through holes in each current collector plate matches the number of openings in a corresponding surface of the battery cell holder 170 to which the current collector plate is coupled. When the current collector plate 190 is coupled to the battery cell holder 170, one through-hole in the current collector plate 190 and the opening 178 in the battery cell holder 170 are aligned with the electrode 182 of the battery cell 180, and another through-hole in the current collector plate 190 and the opening 179 in the battery cell holder 170 are aligned with the electrode 183 of the battery cell 181. Similarly, when the current collector plate 192 is coupled to the battery cell holder 170, one through-hole in the current collector plate 192 and the opening 176 in the battery cell holder 170 are aligned with the electrode 184 of the battery cell 180, and another through-hole in the current collector plate 192 and the opening 177 in the battery cell holder 170 are aligned with the electrode 185 of the battery cell 181.

In some embodiments, a fusible link is coupled to each of the battery cell electrodes. In other embodiments, a fusible link is coupled to one battery cell electrode of each battery cell and a non-fusible conductor is coupled to the other battery cell electrode. FIG. 27 illustrates the exemplary case where a fusible link is coupled to each of the battery cell electrodes. A first fusible link is coupled to the battery cell holder 170 and to the electrode 182 of the battery cell 180. A second fusible link is coupled to the battery cell holder 170 and to the electrode 184 of the battery cell 180. A third fusible link is coupled to the battery cell holder 170 and to the electrode 183 of the battery cell 181. A fourth fusible link is coupled to the battery cell holder 170 and to the electrode 185 of the battery cell 181. In an exemplary configuration, the fusible links are each configured as the fusible link of FIG. 23. In this configuration, each fusible link includes the nickel tab 58, which functions as a battery cell conductor pad, the aluminum fusible conductor 68, and the nickel tab 56, which functions as a current collector conductor pad. The battery cell conductor pad of the first fusible link is electrically and mechanically coupled to the electrode 182. The current collector conductor pad is electrically and mechanically coupled to the current collector plate 190. The current collector conductor pad is positioned proximate an opening 178 in the battery cell holder 170. In the exemplary configuration where the current collector conductor pad has a circular inner perimeter, as shown in FIG. 22, the current collector conductor pad is positioned around the opening 178.

The second fusible link is similarly coupled to the battery cell electrode 184 and to the current collector plate 192, the third fusible link is similarly coupled to the battery cell electrode 183 and to the current collector plate 190, and the fourth fusible link is similarly coupled to the battery cell electrode 185 and to the current collector plate 192. The current collector plate 190 is coupled to an electrical lead to form a negative terminal and the current collector plate 192 is coupled to an electrical lead to form a positive terminal. The positive and negative terminals can be coupled to external components.

Various methods can be used to connect current collector conductor pads to a current collector plate. Methods for connecting current collector conductor pads to a current collector plate include, but are not limited to, resistance welding, laser welding, ultrasonic welding, brazing, soldering mechanical fasteners, and conductive adhesives. Various method can be used to connect a current collector plate to the battery cell holder. Methods for connecting a current collector conductor plate to a battery cell holder include, but are not limited to, adhesives, mechanical fasteners, and welding. In some embodiments, the battery cell housing including the battery cell electrodes are made of Ni-plated Fe (iron or steel) and the fusible link is made of Al (aluminum). In some embodiments, The current collector plate is made of nickel. In other embodiments, the current collector plate is Ni-plated, such as a Ni-plated aluminum current collector plate. As applied to the fusible link, the nickel tabs functioning as the battery cell conductor pad and the current collector conductor pad are particularly amenable to resistive welding and laser welding to the Ni-plated battery cell electrodes and the nickel or Ni-plated current collector plate.

Alternative embodiments are directed to replacing the individual fusible links with a fuse sheet coupled to each current collector plate. A fuse sheet is fabricated from a clad foil having at least two electrically conductive layers. An array of fusible links are integrally formed from the clad foil. The number and positions of the fusible links matches the openings in the battery cell holder and the through-holes in the current collector plate to which the fuse sheet is coupled. In an exemplary configuration, each fusible link includes one or more fusible conductors and a battery cell conductor pad. The current collector conductive pads of each individual fusible link, such as the current collector conductive pad 56 in FIG. 27, are collectively replaced by the fuse sheet. The fuse sheet is aligned with a current collector plate so as to align the array of fusible links with the array of through holes in the current collector plate. The fuse sheet can be coupled to the current collector plate using one of the same methods used to couple the current collector conductive pad to the current collector plate described above.

A clad foil sheet is processed in a similar manner as the clad foil 32 shown in FIGS. 13-20. Masks are applied to the clad foil sheet as part of the two step etching process or the single step etching process described in relation to FIGS. 13-20. FIG. 28 illustrates a top down view of a sheet of clad foil 132 and masks applied to an aluminum layer 134. FIG. 29 illustrates a bottom up view of the sheet of clad foil 132 and masks applied to a nickel layer 136. It is understood that the numbers, shapes, and sizes of the masks are for exemplary purposes only. The exemplary masks and clad foil shown in FIGS. 28 and 29 are configured for the fabrication of a fuse sheet having four fusible links. It is understood that the fabrication process can be applied to form more or less than four fusible links. Masks 140, 141, 142, and 143 are applied to the aluminum layer 134. As shown in FIG. 28, each of the masks 140, 141, 142, and 143 are ring-shaped. In other embodiments, each mask is alternatively shaped. In general, the masks 140, 141, 142, and 143 are shaped to form aluminum fusible conductors or intermediate aluminum conductors that can be subsequently formed into aluminum fusible conductors, such as via a stamping step applied to the intermediate aluminum conductors. Masks 150, 152, 153, 154, and 155 are applied to the nickel layer 136. The dotted lines in FIG. 29 indicate the relative position of the masks 140, 141, 142, and 143 in FIG. 28.

FIG. 30 illustrates a cut out side view of the etched clad foil along the line A-A in FIG. 28 after the two-step etching process or the single step etching process is performed and the masks are removed. The etched clad foil includes etched aluminum layers 144 and 145 having the shapes of the masks 140 and 141, respectively, and etched nickel layers 146, 148, and 149 having the shapes of the masks 150, 152, and 153, respectively.

A first portion of the nickel layer 146 overlaps with a portion of the aluminum layer 144. A second portion of the nickel layer 146 overlaps with a portion of the aluminum layer 145. A third portion of the nickel layer 146 where the aluminum has been removed forms nickel tabs 156. In the embodiment shown in FIGS. 28-30, the nickel tabs 156 is surrounds the ring-shaped aluminum layers 144 and 145. Similarly, a portion of the nickel layer 148 overlaps with a portion of the aluminum layer 144, and a portion of the nickel layer 149 overlaps with a portion of the aluminum layer 145. A remaining portion of the nickel layer 148 where the aluminum has been removed forms a nickel tab 158, and a remaining portion of the nickel layer 149 where the aluminum has been removed forms a nickel tab 159. In the embodiment shown in FIGS. 28-30, the nickel tab 158 is a circle corresponding to the center hole of the aluminum layer 144, and the nickel tab 159 is a circle corresponding to the center hole of the aluminum layer 145. A remaining portion of the aluminum layer 144 where the nickel has been removed forms an aluminum conductor 164, and a remaining portion of the aluminum layer 145 where the nickel has been removed forms an aluminum conductor 165. In some embodiments, the nickel tabs 158 and 159 form battery cell conductor pads to be coupled to battery cell electrodes, and the nickel tabs 156 form current collector conductor tabs to be coupled to a current collector plate.

The aluminum conductors 164 and 165 are processed to form aluminum fusible conductors having application-specific shapes and sizes. As such, the aluminum conductors shown in FIG. 30 also represent aluminum fusible conductors. A stamping step is applied to the aluminum conductors 164 and 165 to form the aluminum fusible conductors. In some embodiments, the stamping step is applied only to the portion of the aluminum layers 144 and 145 that form the aluminum conductor 164 and 165. In other embodiments, the stamping step is applied to the entire aluminum layers 144 and 145, including the portions of the aluminum layers that form the aluminum conductors 164 and 165, and the portions of the aluminum layers that overlap with the nickel layers 146, 148 and 149. In this case, any portions of the nickel layers 146, 148, and 149 that overlap with a stamped portion of the aluminum layers 144 and 145 are also stamped. The stamping process forms the aluminum fusible conductors. In an exemplary configuration, the stamping process forms two aluminum fusible conductors, for example configured similarly to the fusible conductors 64 and 66 in FIG. 22. It is understood that alternative numbers and shapes of the fusible conductors can be formed. The shapes and dimensions of the nickel tabs can also be alternatively configured.

In other embodiments, the aluminum fusible conductor(s) are formed by etching during the etching process. In this case, the masks 140, 141, 142, and 143 are replaced by masks configured to form the aluminum fusible conductor(s), such as the aluminum fusible conductors 64 and 66 in FIG. 22.

The clad foil 132 is similarly processed in the regions corresponding to the other two fusible links not shown in the cut out side view of FIG. 30, for example the two fusible links formed using the masks 142, 143, 154, and 155.

Figure 31:
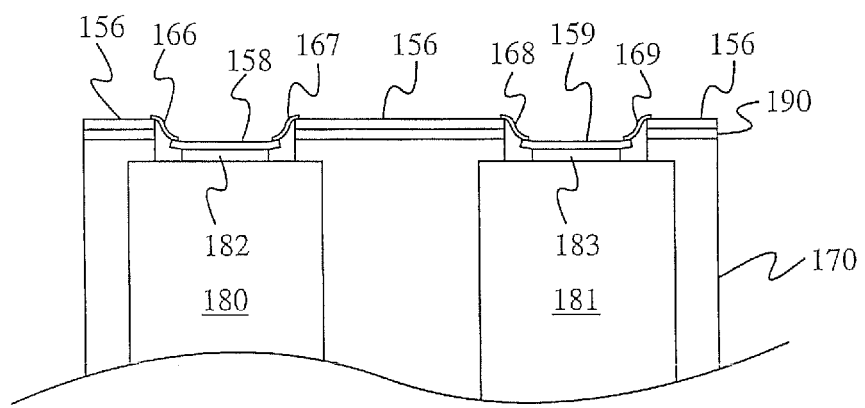
FIG. 31 illustrates a cut out side view of a battery pack including a plurality of fusible links according to a first embodiment.

FIG. 31 illustrates a cut out side view of a battery pack including a plurality of fusible links according to a first embodiment. The battery pack of FIG. 31 is similar to that of the battery pack of FIG. 27 except that the fusible links in FIG. 27 are replaced by fuse sheets such as those fabricated from the etched clad foil in FIG. 30. For simplicity, only one electrode of each battery cell is shown in FIG. 31. It is understood that a fuse sheet can be similarly applied to the other electrode of each battery cell. The battery pack of FIG. 31 includes the battery cell holder 170 and the current collector plate 190 of FIG. 27. The battery pack also includes a fuse sheet coupled to the current collector plate 190. The cut out side view shown in FIG. 31 is the same as the cut out side view of FIG. 27 except that the individual fusible links in FIG. 27 are replaced by the fuse sheet having the battery cell conductor pads 158, 159, the fusible conductors 166, 167, 168, 169, and the current collector conductor pads 156. In some embodiments, a fuse sheet having fusible links is coupled to only one of the two current collector plates, and a conductive sheet having non-fusible links is coupled to the other current collector plate.

Embodiments of the battery pack described in relation to FIGS. 27 and 31 are directed to a single anode current collector plate and a single cathode current collector plate. In other embodiments, more than one anode current collector plate and more than one cathode current collector plate can be used. Embodiments of the battery pack described in relation to FIGS. 28-31 are directed to a single anode-side fuse sheet and a single cathode-side fuse sheet. In other embodiments, more than one anode-side fuse sheet and more than one cathode-side fuse sheet can be used.

The method of fabricating a fusible link is described above as processing a clad foil having an aluminum layer and a nickel layer. It is understood that the fabrication method can be applied to alternatively configured clad foils. For example a clad foil can be used that includes at least one layer suitable for forming a fusible conductor and a second layer suitable for forming a welding pad. The types of materials used for each layer is application specific and depends on the type of welding to be performed and the desired current rating of the fusible conductor.

The fusible link has been described in terms of specific embodiments incorporating details to facilitate the understanding of the principles of construction and operation of the fusible link. Such references, herein, to specific embodiments and details thereof are not intended to limit the scope of the claims appended hereto. It will be apparent to those skilled in the art that modifications can be made in the embodiments chosen for illustration without departing from the spirit and scope of the fusible link.

What is claimed is:

1. A method of fabricating one or more fusible links comprising:
   a. providing a clad foil comprising a first layer and a second layer, wherein the first layer and the second layer are made of different materials;
   b. applying one or more masks to the first layer and one or more masks to the second layer;
   c. selectively etching the first layer and the second layer, thereby forming one or more first portions wherein the first layer is removed and the second layer remains, one or more second portions wherein the first layer is removed and the second layer remains, and one or more third portions wherein the second layer is removed and the first layer remains, wherein each third portion couples one of the first portions to one of the second portions, further wherein each first portion forms a first welding pad and each second portion forms a second welding pad;
   d. removing the one or more masks from the first layer;
   e. removing the one or more masks from the second layer; and
   f. forming one or more fusible conductors from each third portion.

2. The method of claim 1 wherein the one or more fusible conductors are formed by performing a stamping step or a cutting step on each third portion after the one or more masks are removed from the first layer.

3. The method of claim 1 wherein the one or more fusible conductors are formed by etching during the selective etching of the first layer, further wherein the one or more masks applied to the first layer are configured to form the one or more fusible conductors.

4. The method of claim 1 wherein the first layer and the second layer are selectively etched using a single-step etching process.

5. The method of claim 1 wherein the first layer and the second layer are selectively etched using a two-step etching process, further wherein during a first etching step of the two-step etching process a first etchant is used that etches the first layer but not the second layer, and during a second etching step of the two-step etching process a second etchant is used that etches the second layer but not the first layer.

6. The method of claim 1 wherein the clad foil is formed into a single fusible link comprising one first welding pad that forms a battery cell electrode pad, one second welding pad that forms a current collector conductor pad, and one or more fusible conductors coupling the one first welding pad to the one second welding pad.

7. The method of claim 1 wherein the clad foil is formed into a fuse sheet having an array of fusible links, each fusible link for coupling to one battery cell electrode of a battery pack.

8. The method of claim 1 wherein each third portion is coupled to one of the first welding pads via a first clad foil portion that includes both the first layer and the second layer, and each third portion is coupled to one of the second welding pads via a second clad foil portion that includes both the first layer and the second layer.

9. The method of claim 1 wherein the second layer has a higher melting temperature than the first layer.

10. The method of claim 1 wherein the second layer has a higher electrical resistivity than the first layer.

11. The method of claim 1 wherein the first layer comprises aluminum.

12. The method of claim 1 wherein the second layer comprises nickel.

13. The method of claim 1 wherein each first welding pad comprises a battery cell conductor pad, and each second welding pad comprises a current collector element.

14. The method of claim 1 wherein the one or more first welding tabs are welded to battery cell electrodes and the one or more second welding tabs are welded to a current collector plate or to an electrical terminal using resistive welding or laser welding.

15. The method of claim 1 wherein the one or more masks applied to the first layer and the one or more masks applied to the second layer are physical masks.

16. The method of claim 1 wherein the one or more masks applied to the first layer and the one or more masks applied to the second layer are applied using photolithography.

17. The method of claim 1 wherein each fusible conductor opens when a current flow through the fusible conductor reaches a threshold current.

18. A method of fabricating a fusible link assembly comprising:
 a. fabricating a fusible link comprising:
  i. providing a clad foil comprising a first layer and a second layer, wherein the first layer and the second layer are made of different materials;
  ii. applying one or more masks to the first layer and one or more masks to the second layer;
  iii. selectively etching the first layer and the second layer, thereby forming one or more first portions wherein the first layer is removed and the second layer remains, one or more second portions wherein the first layer is removed and the second layer remains, and one or more third portions wherein the second layer is removed and the first layer remains, wherein each third portion couples one of the first portions to one of the second portions, further wherein each first portion forms a first welding pad and each second portion forms a second welding pad;
  iv. removing the one or more masks from the first layer;
  v. removing the one or more masks from the second layer; and
  vi. forming one or more fusible conductors from each third portion; and
 b. welding each of the one or more first welding tabs to a corresponding one battery cell electrode.

19. The method of claim 18 wherein the one or more fusible conductors are formed by performing a stamping step or a cutting step on each third portion after the one or more masks are removed from the first layer.

20. The method of claim 18 wherein the one or more fusible conductors are formed by etching during the selective etching of the first layer, further wherein the one or more masks applied to the first layer are configured to form the one or more fusible conductors.

21. The method of claim 18 wherein the first layer and the second layer are selectively etched using a single-step etching process.

22. The method of claim 18 wherein the first layer and the second layer are selectively etched using a two-step etching process, further wherein during a first etching step of the two-step etching process a first etchant is used that etches the first layer but not the second layer, and during a second etching step of the two-step etching process a second etchant is used that etches the second layer but not the first layer.

23. The method of claim 18 wherein the clad foil is formed into a single fusible link comprising one first welding pad that forms a battery cell electrode pad, one second welding pad that forms a current collector conductor pad, and one or more fusible conductors coupling the one first welding pad to the one second welding pad.

24. The method of claim 18 wherein the clad foil is formed into a fuse sheet having an array of fusible links, each fusible link for coupling to one battery cell electrode of a battery pack.

25. The method of claim 18 wherein each third portion is coupled to one of the first welding pads via a first clad foil portion that includes both the first layer and the second layer, and each third portion is coupled to one of the second welding pads via a second clad foil portion that includes both the first layer and the second layer.

26. The method of claim 18 wherein the second layer has a higher melting temperature than the first layer.

27. The method of claim 18 wherein the second layer has a higher electrical resistivity than the first layer.

28. The method of claim 18 wherein the first layer comprises aluminum.

29. The method of claim 18 wherein the second layer comprises nickel.

30. The method of claim 18 wherein each first welding pad comprises a battery cell conductor pad, and each second welding pad comprises a current collector element.

31. The method of claim 18 wherein the one or more first welding tabs are welded to battery cell electrodes using resistive welding or laser welding.

32. The method of claim 18 further comprising welding each of the one or more second welding tabs to a current collecting element using resistive welding or laser welding.

33. The method of claim 18 wherein the one or more masks applied to the first layer and the one or more masks applied to the second layer are physical masks.

34. The method of claim 18 wherein the one or more masks applied to the first layer and the one or more masks applied to the second layer are applied using photolithography.

35. The method of claim 18 wherein each fusible conductor opens when a current flow through the fusible conductor reaches a threshold current.

* * * * *